United States Patent [19]
Ueno et al.

[11] Patent Number: 4,795,963
[45] Date of Patent: Jan. 3, 1989

[54] TEST METHOD OF A/D CONVERTER

[75] Inventors: Toshiaki Ueno; Fumio Ikeuchi, both of Yokohama; Fumihito Inoue, Higashiyamato, all of Japan

[73] Assignee: Hitachi, Ltd., Tokyo, Japan

[21] Appl. No.: 858,793

[22] Filed: May 1, 1986

[30] Foreign Application Priority Data

May 2, 1985 [JP] Japan .................................. 60-93656

[51] Int. Cl.$^4$ ...................... G01R 29/02; G01D 21/00
[52] U.S. Cl. .................................. 324/57 R; 341/120
[58] Field of Search ................. 324/57 R; 340/347 M, 340/347 CC

[56] References Cited
PUBLICATIONS

Neil et al., Tests Unearth A-D Converter's Real-World Performance, 2/24/82, Electronics, pp. 127–132.
"Need For The Research and Development of High-Speed A/D Conversion" Nikkei Electronics, pp. 137–155, 1984.

Primary Examiner—A. D. Pellinen
Assistant Examiner—Leon K. Fuller
Attorney, Agent, or Firm—Antonelli, Terry & Wands

[57] ABSTRACT

In the A/D converter test method, the square wave pulse as the test signal is supplied to the A/D converter under test; said pulse is converted into the digital signal by said A/D converter; the waveform of said square wave pulse is reconstructed by converting the digital signal outputted from said A/D converter into the analog signal; the rise time of said A/D converter under test is measured from the reconstructed waveform of said square wave pulse; and the dynamic characteristics of said A/D converter is calculated from the measured rise time.

9 Claims, 6 Drawing Sheets

RECONSTRUCTED WAVEFORM
BY ENVELOPE METHOD

RECONSTRUCTED WAVEFORM
BY BEAT METHOD

INPUT TEST WAVEFORM $SR = \dfrac{dv}{dt}$

RECOSTRUCTED WAVEFORM
AFTER A/D CONVERSION

TEST METHOD OF A/D CONVERTER

BACKGROUND OF THE INVENTION

The present invention relates to the test method of the A/D converter, especially that of the dynamic characteristics of the A/D converter.

Recently, demand for high-speed A/D converter has been increasing rapidly for processing of digital signals such as a video signal, the recording of the square wave and measurement in general. Under such circumstances, the importance of the test method used for testing the dynamic characteristics of an A/D converter in operation is increasing. Sometimes the input analog frequency close to or higher than the Nyquist frequency is used, and, in such case, there is the need for the efficient measurement of the dynamic characteristics of the A/D converter which is dependent on the input analog frequency.

According to conventional test methods, as described in "Tests Unearth a-d Converter's Real-World Performance" by Neil, M. and Muto, A., published in Electronics, Vol. 55, No. 4, pp. 127–132, Feb. 24, 1982, and in an article entitled "Increasing Need for the Research and Development of High-Speed A/D Conversion IC in Parallel with the Spread of Video Processing Technology" in Nikkei Electronics, No. 338, pp. 137–155 (1984).

FIG. 2 shows one of the typical conventional test methods discussed in the above-mentioned technical literatures. In this figure, 1 denotes the sine wave generator, 2 denotes a A/D converter under test, 3 a D/A converter, 4 a oscilloscope and 5 denotes a clock generator. The sine wave output of the sine wave generator 1 is inputted to the analog input terminal of the A/D converter 2 to be tested. The A/D converter 2 under test is synchronized with the conversion clock generated by the clock generator 5, and outputs the digital data. The digital data is converted again into the analog signal by the D/A converter 3 whose resolution and the conversion speed are higher than those of the A/D converter 2. In this case, the analog signal can be regenerated by selecting the correlation between the signal frequency $f_{SG}$ generated by the sine wave generator 1 and the conversion clock frequency $f_{SPL}$ of the clock generator 5. As seen from FIG. 3, the envelope waveform of the input sine wave can be regenerated by selecting the relationship $f_{SG}=f_{SPL}/2+\Delta f$, and the beat waveform can be regenerated at the frequency $\Delta f$ by selecting the relationship $f_{SG}=f_{SPL}+\Delta f$. The dynamic characteristics of the A/D converter can be tested by observing said regenerated waveform by the oscilloscope 4. In the case of the conventional test method, however, the sine wave is used as the input test wave, so that the inclination of the waveform or the slew rate at each value of the amplitude of the waveform varies by the individual amplitudes. Thus, the slew rate is especially small near the peak of the wave, and is equivalent to that at the time of the d-c input, so that the dependency of this part on the input signal frequency could not be tested adequately. Besides, testing the band width of the analog input requires a complicated procedure such as the sequential sweep of $f_{SG}$ and the detection of the analog input frequency at which the amplitude of the reconstructed waveform falls by 3 dB.

SUMMARY OF THE INVENTION

The object of the present invention is to provide a test method (of the A/D converter) that not only overcomes the disadvantage of the conventional test method wherein the slew rate varies depending on the amplitude along the analog waveform but also reduces the number of the test items required as in the case of the conventional test method.

The aforementioned object can be accomplished by the present invention which provides a test method of an A/D converter, including the steps of generating a test signal, supplying the generated test signal to the A/D converter under test converting the test signal into the digital signal by said A/D converter, and reconstructing the waveform of said test signal from the digital signal outputted from said A/D converter under test, said method comprising the steps of generating a square wave pulse as said test signal, supplying the square wave pulse to the A/D converter being tested, reconstructing the waveform of said square wave pulse from the digital signal outputted from said A/D converter under test, measuring the rise time of said A/D converter from the reconstructed waveform of said square wave pulse, and determining the dynamic characteristics of said A/D converter being tested from the measured rise time.

DETAILED DESCRIPTION OF PREFERRED EMBODIMENT

The first embodiment of the present invention will be explained in detail in reference to FIG. 1.

Figure 1:
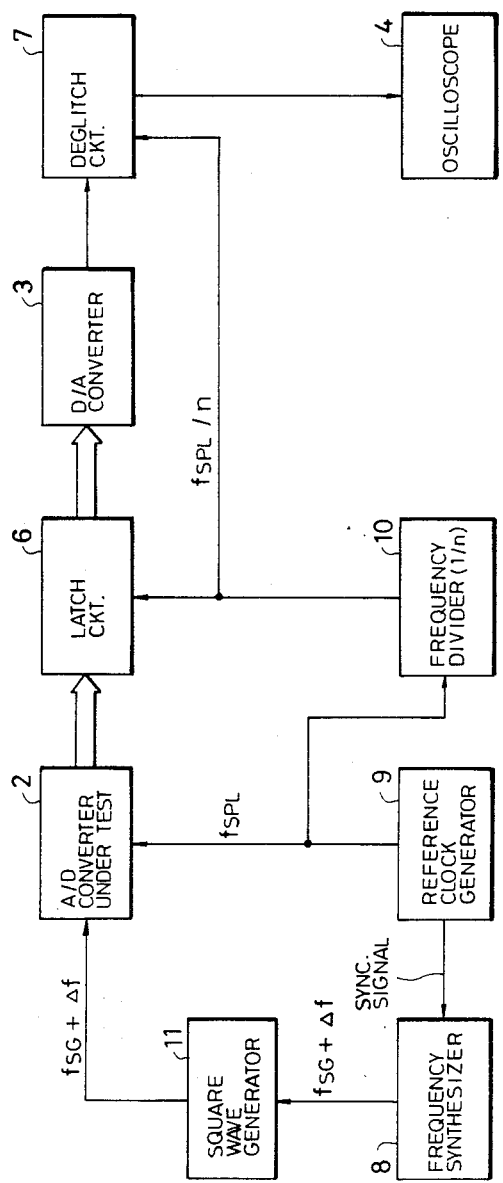
FIG. 1 shows the composition of the dynamic characteristics tester to be used for the realization of the first embodiment of the present invention.
Figure 2:
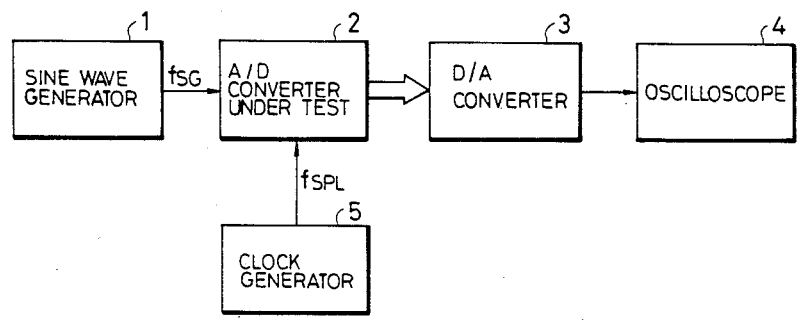
FIG. 2 illustrates a conventional dynamic characteristics tester.
Figure 3A:
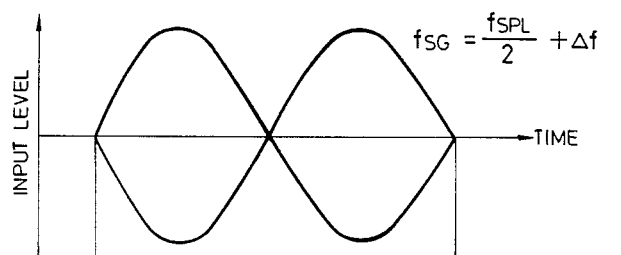
FIGS. 3 (a) and 3 (b) show the reconstructed waveforms according to the conventional test method.
Figure 3B:
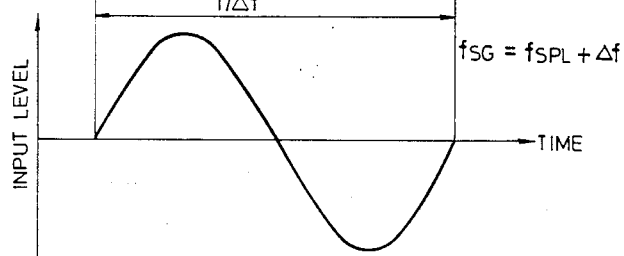

In FIG. 1, 2 denotes an A/D converter under test, 3 a D/A converter, 4 the oscilloscope, 6 the latch circuit, 7 an deglitch circuit, 8 a frequency synthesizer, 9 a reference clock generator, 10 a freguency divider and 11 a square wave generator. The conversion clock generated by the reference clock generator is inputted to the A/D converter 2. The phase relationship between the test square wave generated by the square wave generator 11 and the conversion clock is locked so as to improve the stability of the reconstructed waveform.

For this purpose, the synchronizing signal whose phase is synchronized with the conversion clock is generated by the reference clock generator 9, and said signal is used as the reference signal of the frequency synthesizer 8. Since the phase of the output signal of the frequency synthesizer 8 is synchronized with the phase of the conversion clock and the phase of the output square wave of the square wave generator 11 is synchronized with the phase of the output signal of the frequency synthesizer 8, the phase of the output square wave of the square wave generator 11 is synchronized with the phase of the conversion clock. The output digital data of the A/D converter 2 under test is latched at the interval of 1/n of the conversion clock frequency by adding the clock obtained by dividing the frequency of the conversion clock into n (n: Integer) by the frequency divider 10 to the latch circuit 6. By providing the latch circuit the skew between the output digital data of the A/D converter 2 under test is reduced, and the glitch occurring in the output of the D/A converter 3 is also reduced. The output digital data after the latching is converted again into the analog signal.

In order to reduce glitch occurring in the output of the D/A converter 3 and thus observe an appropriately reconstructed output by the oscilloscope, a deglitch circuit 7 is connected to the output of the D/A converter 3.

The reconstructed waveform is converted into the frequency $\Delta f$ subject to that $f_{SG} = f_{SPL}/n$ where the conversion clock frequency is $f_{SPL}$, the test square wave frequency is $f_{SG} + \Delta f$, and the frequency division is by the number n.

Figure 4A:
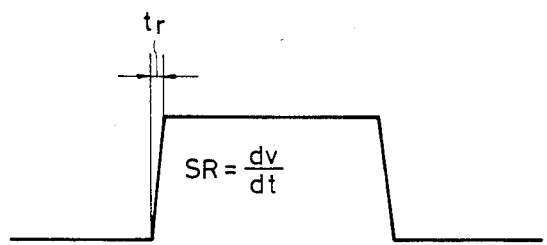
FIGS. 4 (a) and 4 (b) show the respective rise times of the input waveform and the reconstructed waveform according to a first embodiment of the test method provided by the present invention.
Figure 4B:
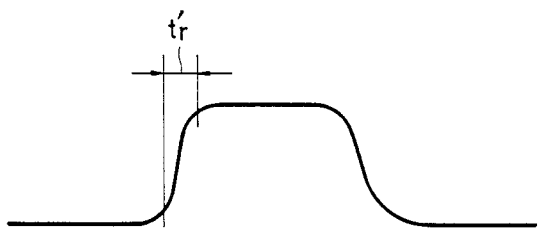
Figure 5:
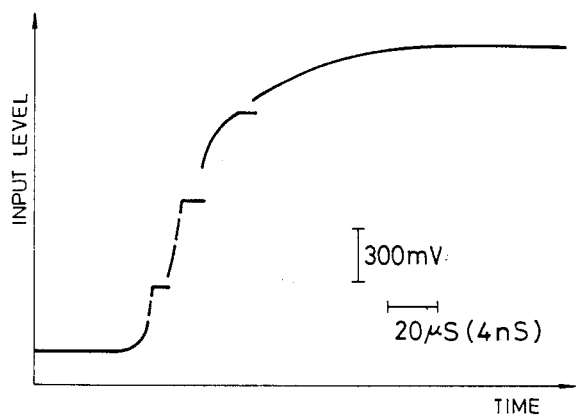
FIG. 5 shows an example of a reconstructed waveform by the trially manufactured tester.

When the reconstructed waveform of the A/D converter against the rise time $t_r$ and the output test waveform having the slew rate $SR = dV/dt$ as shown in FIG. 4 (a) has resulted in the rise time of $t'_r$ as is shown in FIG. 4 (b), the rise time $t_r(AD)$ which is characteristic of the A/D converter can be expressed as $t_r(AD) = \sqrt{t'^2_r - t^2_r}$. Therefore, when the frequency characteristic of the A/D converter takes the form of the first-order integration consisting of the resistance and the electrostatic capacity, its cut-off frequency fc can be approximated as $fc \approx 0.35/t_r(AD)$, and fc can be determined by measuring only the rise time $t'_r$. The input test waveform shown in FIG. 4 (a) has the slew rate which is not only larger than that of the sine wave but is also constant, and the test using this same slew rate can be conducted by adding the amplitude covering the entire input range of the A/D converter 2 under test. Also, the waveform adapted to the characteristic of the A/D converter 2 under test can be selected by making the rise time $t_r$ variable. FIG. 5 shows an example of the reconstructed waveform during the rise period of the A/D converter in the trially provided test circuit. For the test waveform, the square wave having the frequency of 5.001 MHz and the rise time $t_r = 2$ ns is used. The conversion clock frequency is 20 MHz, and the frequency division ratio is 4. In this case, one period of the test waveform is reconstructed as the beat waveform of 1 KHz, and the rise time shown in FIG. 5 is equivalent to 8.8 ns. Therefore, the rise time characteristic of the A/D converter is about 8.6 ns. The cut-off frequency Fc determined based on this value is about 40 MHz. Also, when the rise time $t_r(AD)$ is determined by the output impedance $Z_0$ of the square wave generator 11 and the input electrostatic capacity Cin to the analog input terminal of the A/D converter 2 under test, the value of Cin can be measured from $Cin = 1/(2\pi fc Z_0)$ where the value of the output impedance $Z_0$ is known. On the other hand, in the the waveform corresponding to the period of the rise time, the defect code can be recognized using the portion where the slew rate is relatively large. From this, the portion whose dependency on the slew rate is relatively large can readily be detected.

Next, the second embodiment that is suited for the automatic test will be explained in reference to FIGS. 6 through 9. In the configuration shown in FIG. 6, 2 denotes the A/D converter 2 under test, 8 a frequency synthesizer, 9 a reference clock generator, 11 a square wave generator, 12 a memory, 13 a processing computer, 14 a display unit such as an XY plotter. As for the reference clock generator 9, frequency synthesizer 8 and square wave generator 11, the same phase synchronization requirements exist between the conversion clock frequency $f_{SPL}$ and the test square wave frequency $f_{SG}$ as that in the case of the first embodiment. The output digital data of the A/D converter 2 under test is synchronized with the conversion clock frequency $f_{SPL}$, and is first stored in the memory 12. Then, the output digital data undergoes data rearrangement processing by the computer 13, and is reconstructed into the analog signal. This method is advantageous in that the reconstructed waveform does not include the D/A conversion error, since the D/A converter is not used in this method.

Figure 7:
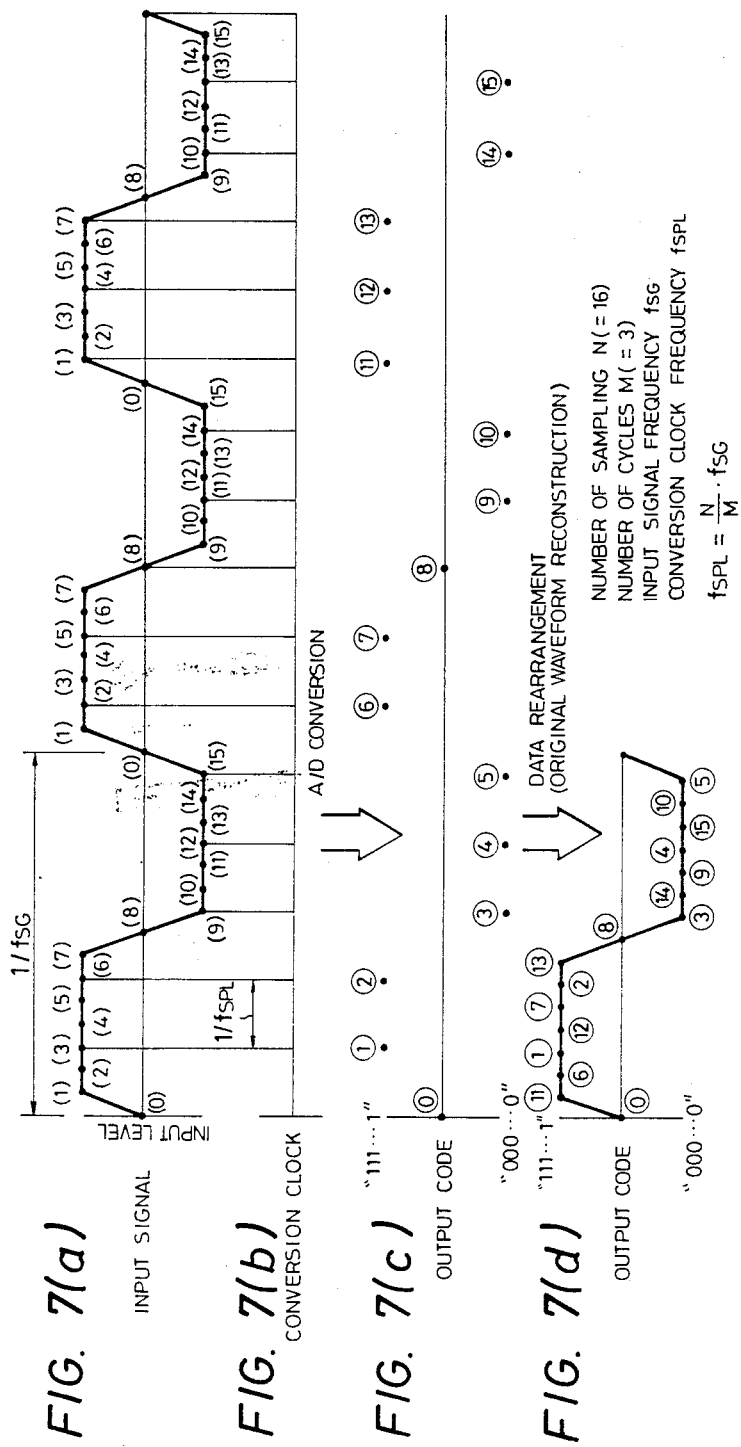
FIGS. 7 (a), 7 (b), 7 (c) and 7 (d), show the waveform for explaining the reconstruction methods.

The aforementioned process of conversion will be explained with details in reference to FIGS. 7 (a), (b), (c) and (d). When conducting the test (of the A/D converter) in the case where the input signal frequency $f_{SG}$ approximates the Nyquist frequency ($=f_{SPL}/2$), an adequate number of samples per period of input signal, and it will become difficult to obtain the adequate information concerning the waveform which is necessary for the test. When the input signal has a constant repetitive period as is shown in FIG. 7 (a), the number of the samples per period of the input signal can thus be increased so that different conditions or parts of the waveform from among the waveforms corresponding to several periods thereof can be obtained, and, as a result, sufficient information of the waveform needed for the test can be obtained. FIGS. 7 (a) through (d) show the examples of the cases where the repetitive input square wave signal (see FIG. 7 (a)) is subjected to the A/D conversion for 3 periods, by the conversion clock (see FIG. 7 (b)). The output digital code obtained through the A/D conversion is as shown in FIG. 7 (c). This output digital code is rearranged by the computer 13 as shown in FIG. 7 (d), and is converted to have a level corresponding to the output digital code so that the reconstructed waveform having the number of the samples which is 3 times that per period in the case shown in FIG. 7 (a) can be obtained. In this case, when the input signal is $f_{SG}$, the data take-in repetition frequency M and the conversion clock frequency $f_{SPL}$, the N as the number of the samples per period of input signal can be obtained by simply satisfying the condition that $f_{SPL} = N/M \cdot f_{SG}$.

Figure 6:
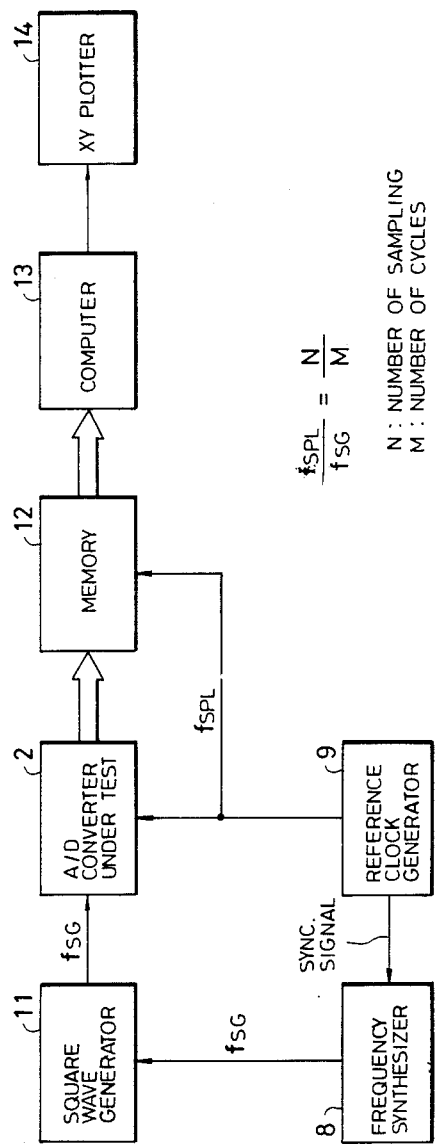
FIG. 6 illustrates a configuration of the dynamic characteristics tester used according to a second embodiment for implementing the test method provided by the present invention.
Figure 8:
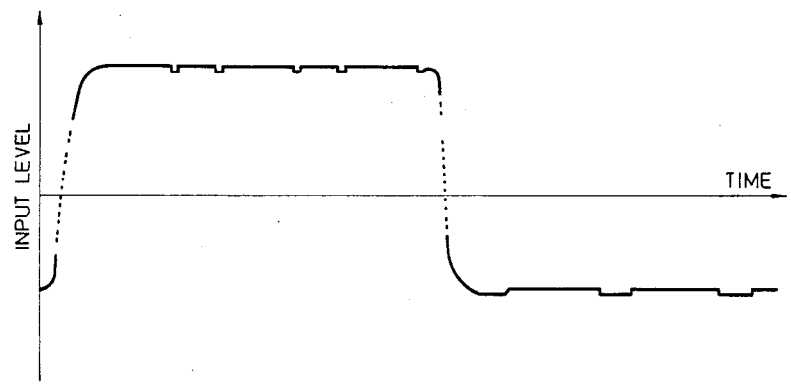
FIG. 8 shows an example of the reconstructed waveform obtained by the test conducted by the trially manufactured test using a proper sample.
Figure 9:
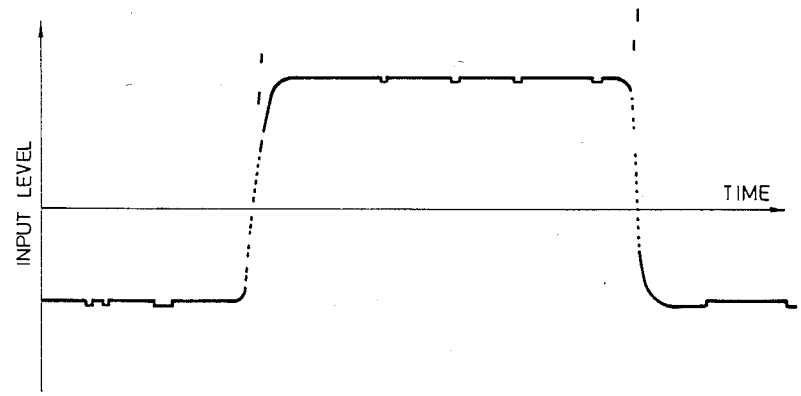
FIG. 9 shows an example of the reconstructed waveform of a bad sample.

FIG. 8 shows an example of the reconstructed waveform of the good sample in the case where the high-speed square wave is inputted to the system shown in FIG. 6. The detailed tests of the portions corresponding to the rise time and the fall time become possible by increasing the number N of sampling. FIG. 9 shows the result of the test of the bad sample which has been conducted under the same conditions as those of the case shown in FIG. 8. In this case, the defective code has occurred in the portions corresponding to the rise time and the fall time, and the dependency on the slew rate can be tested. In the cases shown in FIG. 8 and FIG. 9 respectively, the process for determining the cut-off frequency fc of the A/D converter from the rise time is the same as that in the case of the first embodiment. This embodiment enables the A/D converter 2 to be tested automatically at any test frequency by controlling the frequencies of the signals generated by the reference clock generator 9 and the frequency synthesizer 8 respectively by the computer and automatically comparing the reconstructed waveform with the waveform of the good sample which has been determined in advance. Furthermore, the cut-off frequency fc can be measured automatically by determining the rise time $t'_r$ by the waveform recognition.

The present invention enables the reduction of the difference in the slew rate between the different amplitudes of the input test waveform in the case of the A/D converter test, by using the square wave pulse or the step pulse having sharp rise and fall characteristics as the test signal. Furthermore, as for the conversion characteristic of the A/D converter, the portion which is highly dependent on the slew rate can be detected by examining the portions corresponding to the rise time and the fall time, whereby the defective code which has occurred can readily be detected. As for the frequency band width test, in the case of the conventional test method, the cut-off frequency has to be detected by sweeping the sine wave, but, in the case of the test method relating to the present invention, the same test can be performed easily based on the rise time of the reconstructed waveform. Besides, when the square wave generator having the known output impedance is used, the input electrostatic capacity of the A/D converter under test at its analog input terminal can be determined from the rise time.

As explained in the foregoing, under the test method provided by the present invention, the various items of the dynamic characteristics can be tested by single test method, whereas the same have to be tested by different procedures in the case of the conventional test method, and thus the test method provided by the present invention contributes in not only to its simplification but also results in the speeding up of the dynamic characteristics test of the A/D converter.

What is claimed is:

1. A method of testing an A/D converter including the steps of generating a test signal, supplying the generated test signal to said A/D converter, converting said test signal into a digital signal by said A/D converter, and reconstructing the waveform of said test signal from the digital signal outputted from said A/D converter, said method comprising the steps of: generating a square wave pulse as said test signal, supplying said square wave pulse to said A/D converter, reconstructing the waveform of said square wave pulse from the digital signal generated from said A/D converter, measuring the rise time characteristic of said A/D converter from the reconstructed waveform of said square wave pulse, and determining the dynamic characteristics of said A/D converter from the measured rise time.

2. A method of testing an A/D converter according to claim 1, wherein said A/D converter has a cut-off frequency $f_c$ which can be determined by the expression $f_c \approx 0.35/t_r(AD)$ where $t_r(AD)$ corresponds to the rise time of said A/D converter.

3. A method of testing an A/D converter according to claim 2, wherein said A/D converter has an input electrostatic capacity Cin which can be determined by the expression $C_{in} = 1/2\pi f_c Z_0$ where the output impedance of the square wave generator which generates said square wave is given as $Z_0$, and the cut-off frequency of said A/D converter is given as $f_c$.

4. A method for testing an analog-to-digital converter comprising the steps of:
generating and applying a pulse wave signal as a test signal and a clock signal as a conversion signal at said analog-to-digital converter, wherein said test signal and said clock signal being phase synchronized;
converting said test signal by said analog-to-digital converter into corresponding digital data;
latching said digital data at a sampling frequency which is a fraction of said conversion signal;
converting said latched digital data into a reconstructed square wave pulse signal; and
measuring the rise time characteristic of said analog-to-digital converter using the rise time of said reconstructed square wave pulse, and determining the dnyamic characteristic of said analog-to-digital converter based on the measured rise time.

5. A method for testing an analog-to-digital converter according to claim 4, wherein said pulse wave test signal is a periodic square wave signal.

6. A method for testing an analog-to-digital converter, according to claim 5, wherein the step of latching includes frequency dividing said conversion signal and latching said digital data at intervals corresponding to the frequency divided conversion signal so as to reduce skew between said digital data outputted by said analog-to-digital converter.

7. A method for testing an analog-to-digital converter, according to claim 5, wherein the step of converting said digital data into a reconstructed pulse wave signal includes using a D/A converter and a means for reducing glitch noise adversely affecting the square wave pulse signal being reconstructed.

8. A method of testing an analog-to-digital converter comprising the steps of:
generating and applying a pulse wave signal as a test signal and a clock signal as a conversion signal at said analog-to-digital converter, wherein said test signal and said clock signal being phase synchronized;
converting a plurality of samplings of said test signal period by said analog-to-digital converter into corresponding digital data synchronously with conversion clock signal frequency;
storing said digital data into respective storage locations in a memory;
reconstructing said digital data by a process of data rearrangement so that the reconstructed waveform is effected by rearranging the digital data stored corresponding to the number of samplings in said plurality of samplings; and
measuring the rise time characteristic of said analog-to-digital converter using the rise time of said reconstructed square wave pulse, and determining the dynamic characteristics of said analog-to-digital converter based on the measured rise time.

9. A method for testing an analog-to-digital converter according to claim 8, wherein said pulse wave test signal is a periodic square wave signal.

* * * * *